United States Patent
Solovyov

(10) Patent No.: US 10,811,589 B2
(45) Date of Patent: Oct. 20, 2020

(54) REEL-TO-REEL EXFOLIATION AND PROCESSING OF SECOND GENERATION SUPERCONDUCTORS

(71) Applicant: Brookhaven Technology Group, Inc., Stony Brook, NY (US)

(72) Inventor: Vyacheslav Solovyov, Rocky Point, NY (US)

(73) Assignee: Brookhaven Technology Group, Inc., Stony Brook, NY (US)

( * ) Notice: Subject to any disclaimer, the term of this patent is extended or adjusted under 35 U.S.C. 154(b) by 55 days.

(21) Appl. No.: 16/331,065

(22) PCT Filed: Sep. 7, 2017

(86) PCT No.: PCT/US2017/050398
§ 371 (c)(1),
(2) Date: Mar. 6, 2019

(87) PCT Pub. No.: WO2018/048979
PCT Pub. Date: Mar. 15, 2018

(65) Prior Publication Data
US 2019/0237650 A1 Aug. 1, 2019

Related U.S. Application Data

(60) Provisional application No. 62/384,364, filed on Sep. 7, 2016, provisional application No. 62/427,239, filed on Nov. 29, 2016.

(51) Int. Cl.
*H01L 39/24* (2006.01)
*B23K 1/00* (2006.01)
(Continued)

(52) U.S. Cl.
CPC .......... *H01L 39/248* (2013.01); *B23K 1/0008* (2013.01); *C23C 14/18* (2013.01); *C23C 14/5806* (2013.01); *B23K 2101/38* (2018.08)

(58) Field of Classification Search
CPC .................. H01L 39/248; H01L 39/2403
See application file for complete search history.

(56) References Cited

U.S. PATENT DOCUMENTS

| 5,149,681 A | 9/1992 | Ohkawa |
| 6,828,507 B1 | 12/2004 | Fritzemeier |

(Continued)

FOREIGN PATENT DOCUMENTS

| GB | 1288203 | 9/1972 |
| GB | 2498961 A | 8/2013 |
| JP | 8264039 | 10/1996 |

OTHER PUBLICATIONS

Van der Laan et al., Delamination Strength of YBCO Coated Conductors under Transverse Tensile Strength, Superconduct. Sci. Technol. 20, Jun. 21, 2007.

(Continued)

*Primary Examiner* — Errol V Fernandes
(74) *Attorney, Agent, or Firm* — Schroeder Law PC

(57) ABSTRACT

The substrate and buffer layers, of either one-sided or two-sided superconducting tape, are separated from the YCBO layer(s) of the tape by a combined action of radiative or inductive heat and mechanical force via a reel-to-reel manufacturing process. The exfoliation process may also utilize an air blade(s) to facilitate the separation of the layers of the tape.

35 Claims, 7 Drawing Sheets

(51) Int. Cl.
  *C23C 14/18*    (2006.01)
  *C23C 14/58*    (2006.01)
  *B23K 101/38*   (2006.01)

(56) References Cited

U.S. PATENT DOCUMENTS

| | | |
|---|---|---|
| 7,071,148 B1 | 7/2006 | Selvamanickam |
| 7,816,303 B2 | 10/2010 | Thieme |
| 8,044,752 B2 | 10/2011 | Otto |
| 8,437,819 B2 | 5/2013 | Takayasu |
| 8,731,629 B2 | 5/2014 | King |
| 2005/0009981 A1 | 1/2005 | Chen |
| 2008/0020304 A1 | 1/2008 | Schroder |
| 2008/0180202 A1 | 7/2008 | Otto |
| 2008/0236743 A1 | 10/2008 | Kye |
| 2009/0087234 A1 | 4/2009 | Roof |
| 2009/0233800 A1 | 9/2009 | Huang |
| 2009/0298696 A1 | 12/2009 | Otto |
| 2010/0022396 A1 | 1/2010 | Otto |
| 2010/0184604 A1 | 7/2010 | Roden |
| 2012/0211475 A1 | 8/2012 | Oswald |
| 2012/0214675 A1 | 8/2012 | van der Laan |
| 2014/0155269 A1 | 6/2014 | Daibo |
| 2015/0248952 A1 | 9/2015 | Ko |
| 2015/0251227 A1 | 9/2015 | Koelmel |
| 2016/0027555 A1 | 1/2016 | Nagasu |
| 2016/0125977 A1* | 5/2016 | Machi ............... H01B 13/0009 174/125.1 |
| 2018/0330849 A1* | 11/2018 | Rupich ............... H01L 39/2448 |
| 2020/0194909 A1* | 6/2020 | Brittles ............... H01L 39/24 |

OTHER PUBLICATIONS

Floegel-Delor et al., Operation and Experience of a 2 km Coated Conductor Reel-to-Reel Copper Pulse Plating Facility, Journel of Physics: Conference Series, 2014.

Maeda et al., Recent Developments in High-Temperature Superconducting Magnet Technology (Review), ISEE Transactions on Applied Superconductivity, vol. 40, No. 3, Jun. 2014.

Solovyov, et al., Exfoliated YBCO Filaments for Second-Generation Superconducting Cable, Superconducting Science and Technology, Nov. 15, 2016.

* cited by examiner

| Material | Thickness (μm) | Density (g/cm³) | Specific heat (J/kg*K) | Therm. cond. (W/m*K) | Mass (gr) | Diffusion time (s) |
|---|---|---|---|---|---|---|
| Copper | 100 | 8.9 | 385 | 382 | 0.53 | 8.9x10⁻⁵ |
| Solder (Indalloy®106) | 20 | 8.8 | 167 | 70 | 0.10 | 8.4x10⁻⁶ |
| Silver | 2 | 10.4 | 233 | 406 | 0.01 | 2.3x10⁻⁸ |
| YBCO | 1.2 | 6.3 | 420 | 8 | 0.004 | 4.7x10⁻⁷ |
| Total | | | | | 0.66 | 9.7x10⁻⁵ |

REEL-TO-REEL EXFOLIATION AND PROCESSING OF SECOND GENERATION SUPERCONDUCTORS

This invention was made with government support under Contract No. DE-SC0013856 awarded by the Department of Energy. The government has certain rights in the invention.

BACKGROUND OF THE INVENTION

The present invention relates to the manufacturing of high-temperature superconducting yttrium-barium-copper-oxide filaments via the exfoliation of a superconducting layer from an epitaxial substrate via a reel-to-reel manufacturing process.

The advent of second generation (2G) $YBa_2Cu_3O_7$ (YBCO) wire technology has spawned impressive technological progress since the first meter of 2G wire was manufactured in 1995. Further developments in the field have been driven by existing and emerging applications, such as fault current limiters, transformers, and wind turbines. The second generation superconducting (2G) wires have record high upper critical field and critical temperature, which could be used in various industrial and commercial applications. The core 2G wire technology can be described as a thin (<2 micron) YBCO layer deposited on a 50-100 micron thick metal substrate. FIG. 1 shows the construction of a commercially-available RABiTS-based 2G wire (product of AMSC Corp. marketed as Amperium wire), referred to herein as tape 100. Tape 100 includes an approximately 100 micron thick metal substrate 103. Substrate 103 is coated with an oxide buffer 102, which is formed from a sequence of layers of various oxides, for example yttrium oxide, yttrium-zirconium oxide and cerium oxide. Oxide buffer 102 is typically deposited by a vacuum deposition method, such as reactive sputtering or electron beam evaporation. A layer of yttrium barium copper oxide superconductor Y—$ReBa_2Cu_3O_{7-x}$ (YBCO), referred to herein as superconducting layer 101, is grown on oxide buffer 102. In this commercially-available product, Re is a rare-earth metal, such as Dy, Gd, Nd, and x is the oxygen index, with x<1. A protective silver layer 104 is deposited on top of superconducting layer 101 by magnetron sputtering. Finally, tape 100 is solder-plated with opposing top and bottom metal foils, forming stabilizing layers 105 and 107, respectively. The stabilizing layers 105, 107 are 1-2 mm wider than the remainder of the tape, so a pair of opposing solder fillets 106 are formed in order to join the two stabilizer foils.

Commercially-available 2G wires, such as the wire shown in FIG. 1, are often delivered as high-aspect ratio tapes with the wide side being on the order of 4-12 mm and the thickness being on the order of 100-150 microns, whereas the thickness of superconducting layer 101 is on the order of 1-2 microns. The architecture associated with known commercially-available wires presents a number of problems, particularly when this architecture is used in magnet applications:

i) The high aspect ratio ($\approx$1:1000) contributes to the magnetization (AC) losses, which can be as great as 10's of J/m of wire. This limits commercial application of the wire to low-field 77 K devices, such as transmission cables, fault current limiters and large trapped-field synchronous motors and generators.

ii) The superconducting layer 101 is insufficiently stabilized because only the top surface of superconducting layer 101 is in good electrical contact with the exterior stabilizer layers 105, 107 of tape 100. The bottom surface of superconducting layer 101 is in contact with the insulating oxide buffer 102. The stabilizing layer adjacent to the substrate, namely stabilizer layer 107, shares only a fraction (<10%) of the current with superconducting layer 101 and top stabilizer layer 105. This asymmetric nature of the conductor architecture contributes to the non-uniform conductor heating during a quench, which is known to causes delamination of the superconducting layer, and subsequent failure.

iii) Tape 100 exhibits highly anisotropic mechanical properties. Commercially-available 2G wires are exceptionally strong in the direction along the tape, the tensile axial yield strength being approximately 500-600 MPa. However the c-axis pull (transverse) strength is $\approx$10 times lower and the cleavage strength is almost negligible (<1 MPa). This is due, at least in part, to the poor adhesion between superconducting layer 101 and oxide buffer 102. The unpredictable separation of the superconducting layer from the oxide buffer, even under very moderate stress (<10 MPa), has been identified as the source of several magnet failures.

iv) A 2G tape, such as that shown in FIG. 1, allows only for pancake-type windings. Assembling a solenoid magnet from pancakes requires labor-intensive splicing of the individual pancakes via diagonal splices.

v) The architecture of a 2G tape does not allow for a simple splicing of a multi-strand cable. The interface between YBCO layer 101 and top stabilizer layer 105 has a typical resistance of less than 50 n$\Omega$/cm$^2$. However, the resistance between YBCO layer 101 and bottom stabilizer 107 is on the order of 100 μ$\Omega$/cm$^2$. Therefore, the manufacture of a multi-strand cable requires an elaborate splicing procedure that ensures that only top stabilizer surfaces are in contact with each other.

There is therefore a need in the art for high-temperature superconducting filaments which can be used in various industrial and commercial applications. There is a further need in the art for a method of manufacturing high-temperature superconducting filaments and cables with reduced/eliminated risk of delamination of the superconducting layer, which exhibit more uniform electrical properties, which exhibit enhanced mechanical properties, and which may be readily spliced together.

SUMMARY OF THE INVENTION

The present invention relates to a method for manufacturing high-temperature superconducting filaments from a 2G wire using a reel-to-reel exfoliation process. The reel-to-reel exfoliation process includes the step of loading the 2G wire on a first reel. The 2G wire includes a superconducting layer positioned upon a metal substrate, wherein the superconducting layer is coated with a protective metal layer, such as silver. The wire is passed over an inductive coil—which rapidly heats the wire, resulting in the partial or complete exfoliation of the superconducting layer from the substrate. The separated superconducting layer is spooled on a second reel and the substrate is spooled on a third reel.

The present invention further relates to a method for continuous separation of the substrate from the superconducting layer. The method includes the step of tensioning the wire with a predetermined load applied at a predetermined angle to achieve clean separation of the substrate from the superconducting layer.

The present invention further relates to a method of reel-to-reel slicing of the exfoliated filament. The slicing is preferably performed by an industrial CO2 laser. The slicing is performed by synchronizing the motion of the laser beam and the tape. A single laser head will perform the tape slicing into filaments that are at least 2 mm wide.

The present invention further relates to a method of coating the exfoliated filaments with a silver layer, and thereafter processing the silver layer in order to achieve low resistivity. The silver layer processing step involves the application of high-frequency radiation that is confined to the silver layer.

The present invention further relates to a method of reel-to-reel coating of the filaments with a solder layer that will allow fusing of the filaments in an inter-connected filament stack. The filaments are coated with a solder paste and passed through a high-temperature zone, where the solder is melted, thus forming a continuous solder layer.

The present invention further relates to a method of assembling a high-temperature superconducting cable from the exfoliated filaments. The cable includes a plurality of twisted filaments. Each of the filaments includes a superconducting layer having a protective coating substantially covering each surface thereof. Each of the filaments further includes at least one metallic stabilizing layer adhered thereto. Each of the filaments is encapsulated with an electrically-conductive material. The filaments are twisted with a pitch less than 100 mm in order to reduce magnetization loss of the cable.

The present invention further relates to a method of reel-to-reel exfoliation utilizing an air blade to facilitate the separation of the YCBO layer(s) from the substrate. One or more air blades may be utilized depending on the application. The air forming the air blade can be heated or cooled. In one preferred embodiment, a separation angle β is formed between the YCBO layer(s) from the substrate, separation angle β preferably ranging from 1 to 10 degrees.

BRIEF DESCRIPTION OF THE DRAWINGS

FIG. 6 is a summary table of the thermal properties of the filament formed in accordance with the present invention.

DETAILED DESCRIPTION OF THE INVENTION

Figure 1:
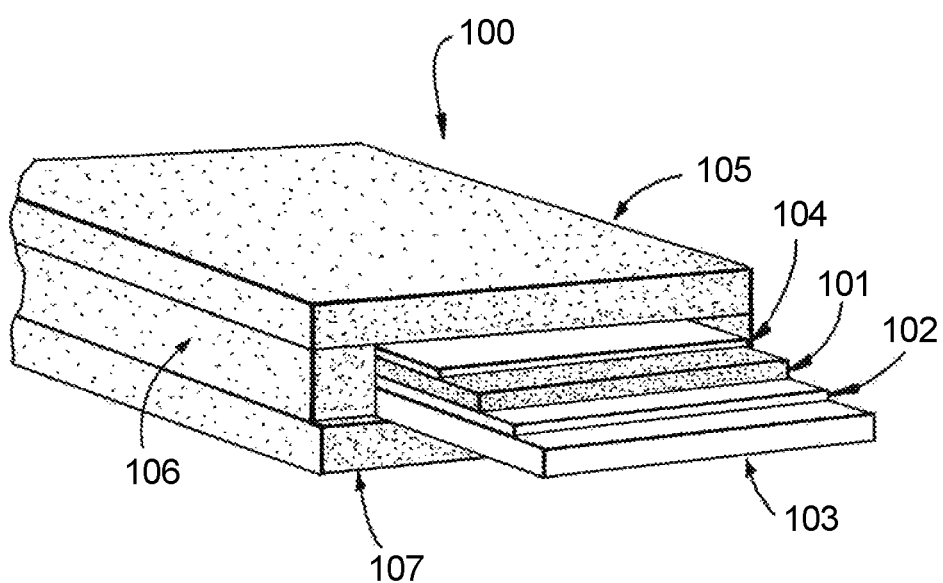
FIG. 1 is an illustrative view of the epitaxial layers in a commercially-available 2G wire.
Figure 2A:
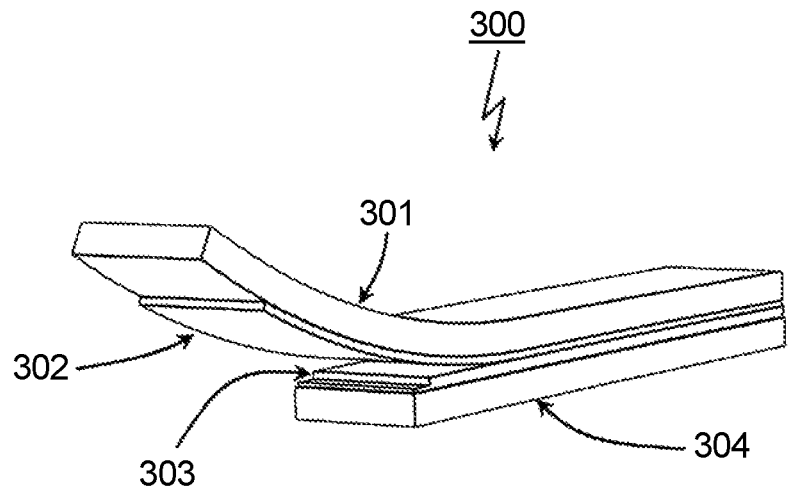
FIG. 2A is an illustrative view of a 2G wire where the substrate and buffer layers are partially separarated from the superconducting layer.

A partially exfoliated second generation (2G) wire, i.e., tape 300 is shown in FIG. 2A. Tape 300 is preferably on the order of 100-1000 meters long and 1-100 mm wide. Tape 300 includes a metal substrate 301, a buffer layer 302, a superconducting layer 303, and a stabilizing metal layer 304. The stabilizer layer 304 can be made of copper, stainless steel, bonze or another conductive metal. In a preferred embodiment, the tape is subjected to an external action, which increases the stress level between the superconducting layer 303 and the buffer layer 302. This external action can be accomplished by, for example, rapid heating by an external source, such as an inductive coil, infrared radiation or radio-frequency radiation. The external action can also be accomplished by a mechanical deformation of the tape, such as bending. The stress level is preferably raised to a level where the substrate 301 and the buffer layer 302 can be mechanically separated from the superconducting layer 303 without damaging the latter in a process referred to as exfoliation.

Figure 2B:
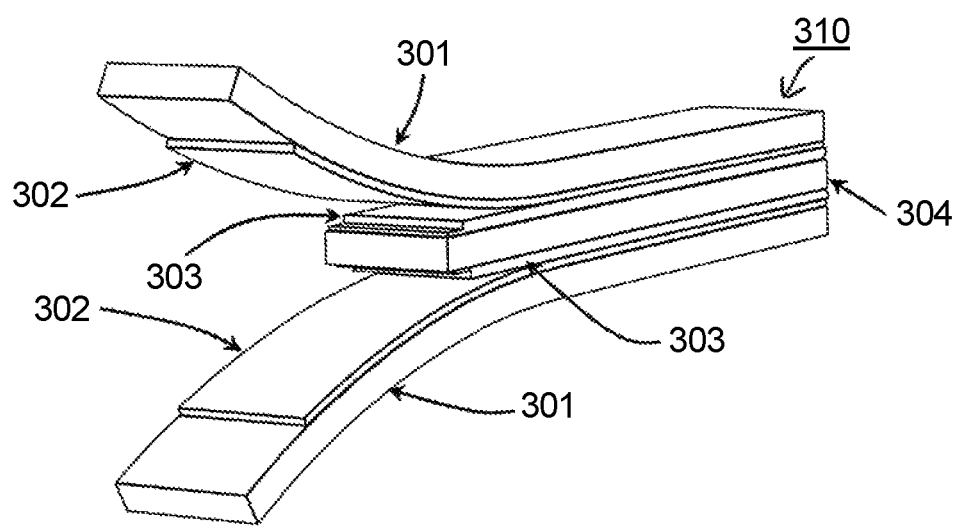
FIG. 2B is an illustrative view of a two-sided 2G wire, wherein the superconducting layers are soldered to a common stabilizer, and the top and bottom substrate and buffer layers are separated from the top and bottom superconducting layers.

FIG. 2B illustrates the exfoliation process of a two-sided 2G tape 310. As discussed above, an external action is applied to substrates 301 so that both upper and lower substrates are separated. The remaining structure is formed from stabilizer layer 304 and two superconducting layers 303 attached to the top and bottom sides of the stabilizer layer.

Figure 3A:
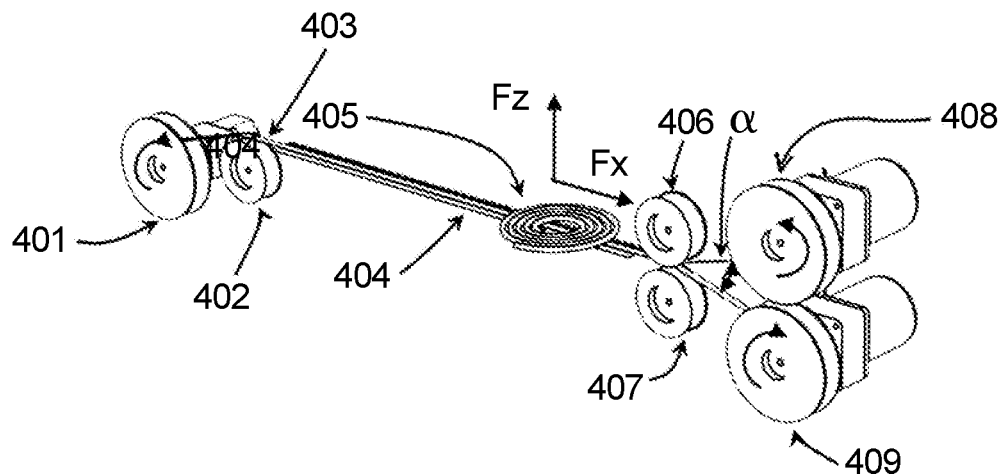
FIG. 3A is a view showing a reel-to-reel exfoliation system for processing one-sided wire, as shown in FIG. 2A.

FIG. 3A is a schematic presentation of the reel-to-reel exfoliation process of a one-sided tape, such as the tape shown in FIG. 2A. The 2G tape is wound on a reel 401 which is connected to a shaft of a stepper motor 403. In an alternative embodiment, the 2G tape is fed directly into the process from a continuous source of tape. An idler roller 402 maintains constant position of the tape with respect to a tape guide 404. An inductive coil 405 is placed directly over the tape. Idler rollers 406 and 407 feed the separated tape layers towards reel 408 and reel 409, respectively. The substrate and buffer layers are then spooled on reel 408, which is attached to a torque motor. The stabilizer with the YBCO layer is then spooled on reel 409, which is also attached to a torque motor. The position of reels 408 and 409 determines the separation angle α. Separation angle α is preferably in the range of from about 2 degrees to about 30 degrees. The torque applied by one or both of the torque motors generates a force F that has a component normal to the tape Fz and lateral component Fx. It is the action of the normal component Fz, together with the heating from the inductive coil, which causes separation of the substrate from the superconducting layer.

Figure 3B:
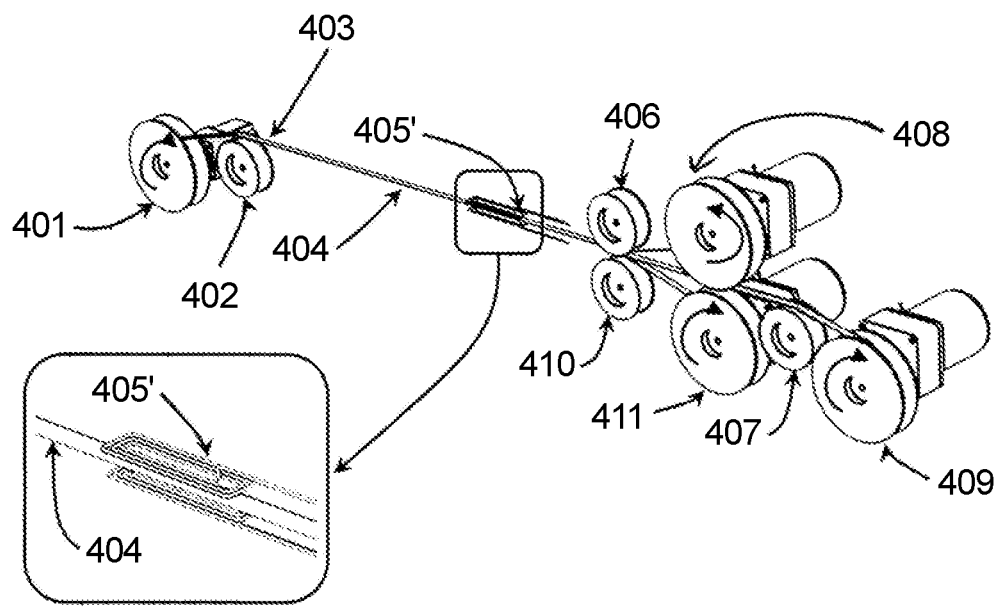
FIG. 3B is a view showing a reel-to reel exfoliation system for processing a two-sided wire, as shown in FIG. 2B.

FIG. 3B is a schematic presentation of the reel-to-reel exfoliation process of a two-sided tape, such as the tape shown in FIG. 2B. In an alternative embodiment, the 2G tape is fed directly into the process from a continuous source of tape. Here, inductive coils 405' apply heating to the top and bottom substrate/buffer layers. The position of reels 408 and 411 determine the angle of separation of the top and the bottom substrate/buffer layers from the tape. The exfoliated 2-sided tape is spooled to a reel 409. Torque applied by the torque motors connected to reels 409, 408 and 411 determines the absolute tape tension and the separation force magnitude for both top and bottom substrate/buffer layers.

Figure 3C:
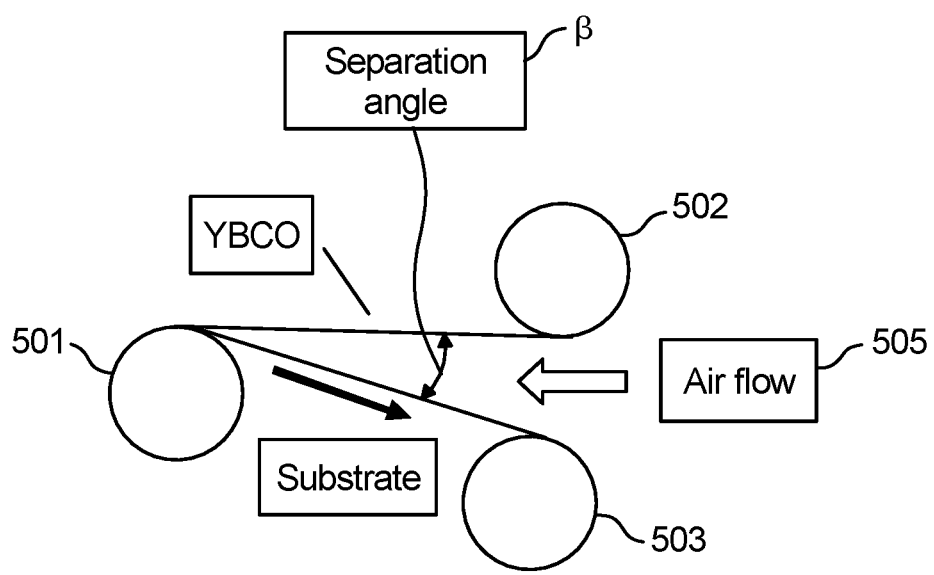
FIG. 3C is a view showing another reel-to-reel exfoliation system.

Referring now to FIG. 3C, the reel-to-reel exfoliation process can utilize an "air blade" to facilitate the separation of the YBCO layer(s) from the substrate. An air blade is a sheath of compressed air which is formed by directing air through a flat, slit-like nozzle. The air pressure facilitates the uniform and even separation of the layers of the starting material. Of course, more than one air blade may be utilized if, for example, a 2-sided tape is being exfoliated. It is contemplated herein that the air blade method can be used in conjunction with the application of tension to the starting material. Additionally, the air coming from the air blade can be either heated or cooled, whereby thermal stress can be applied to the exfoliated area, which may be desirable in certain exfoliation processes.

In the air-assisted exfoliation process shown in FIG. 3C, the tape is supplied by spool 501. The take-up spools 502 and 503 are positioned to provide a separation angle β between the YBCO layer(s) and the substrate. The separation angle β determines the normal, or pull pressure, exerted on a tape, and preferably ranges from 1 to 10 degrees. In one preferred embodiment, a tension of up to about 10 N is applied to the tape during the reel-to reel process. Depending on the strength of the substrate-YBCO interface, the preferred range of 1 to 10 degrees for separation angle β will typically provide the desired separation pressure to the tape.

An air blade 505 preferably delivers air into the gap formed between the exfoliated YBCO layer(s) and the substrate, thus creating an additional separating action. In order to deliver pressure on the order of 20-50 MPa, flow on the order of 100 L/min of compressed air is required. It has been discovered herein that the air-assisted separation technique provides a substantially uniform and smooth pressure field, which facilitates the separation of the YBCO layer(s) from the substrate.

Figure 4:
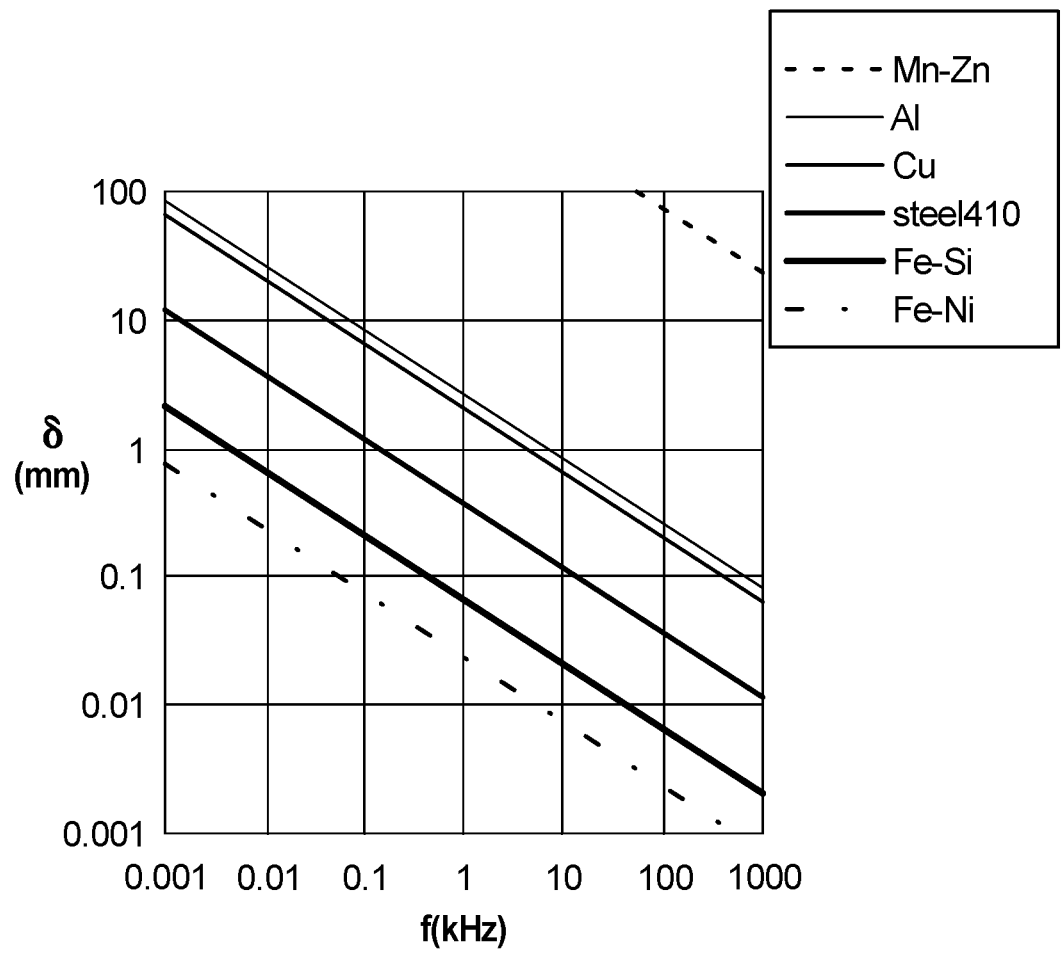
FIG. 4 is a graphical representation of the skin penetration depth vs. the radiation frequency.

After exfoliation, a protective metal layer is preferably deposited over the superconductor layer of the superconducting tape for the purposes of protecting the superconductor layer and providing a path for the electrical current if the superconductor becomes locally resistive due to overheating or spontaneous loss of superconductivity. The protective silver layer deposited on the exfoliated YBCO surface needs to be treated in order to improve adhesion of silver to YBCO, and reduce the interfacial resistance. Conventionally, a short annealing step at approximately 400° C. is performed, resulting in a Ag-YBCO interface resistivity reduction from $10^{-5}$ Ω*cm$^2$ to <$10^{-8}$ Ω*cm$^2$. However, this approach is not appropriate for the present exfoliated filament because the YBCO layer is typically attached to the stabilizer with a low-temperature (200-240° C. melting point) solder. It has been discovered herein that a short application of GHz-range microwave power to the coated tape delivers structural improvement identical to thermal processing, but at a significantly reduced temperature. The effect is explained by the electro-migration of metal ions under large ($10^7$ A/m$^2$) inductive eddy current that can be easily generated in a conductive film by modern magnetron sources. This is because at 2.45 GHz, the common industrial processing frequency, the skin depth of silver (specific resistivity $1.5 \times 10^{-6}$ Ω*cm) is 1.2 μm (as shown in FIG. 4), which means that the inductive currents are confined in the silver layer. A 2.45 GHz system has several advantages. First, the magnetrons and waveguide components are mass-manufactured for household (microwave ovens) and industrial markets. Second, the waveguides and applicators are large, for example a popular WR340 waveguide is 86.36× 43.18 mm, allowing for uniform treatment of 46 mm wide strip.

Figure 5:
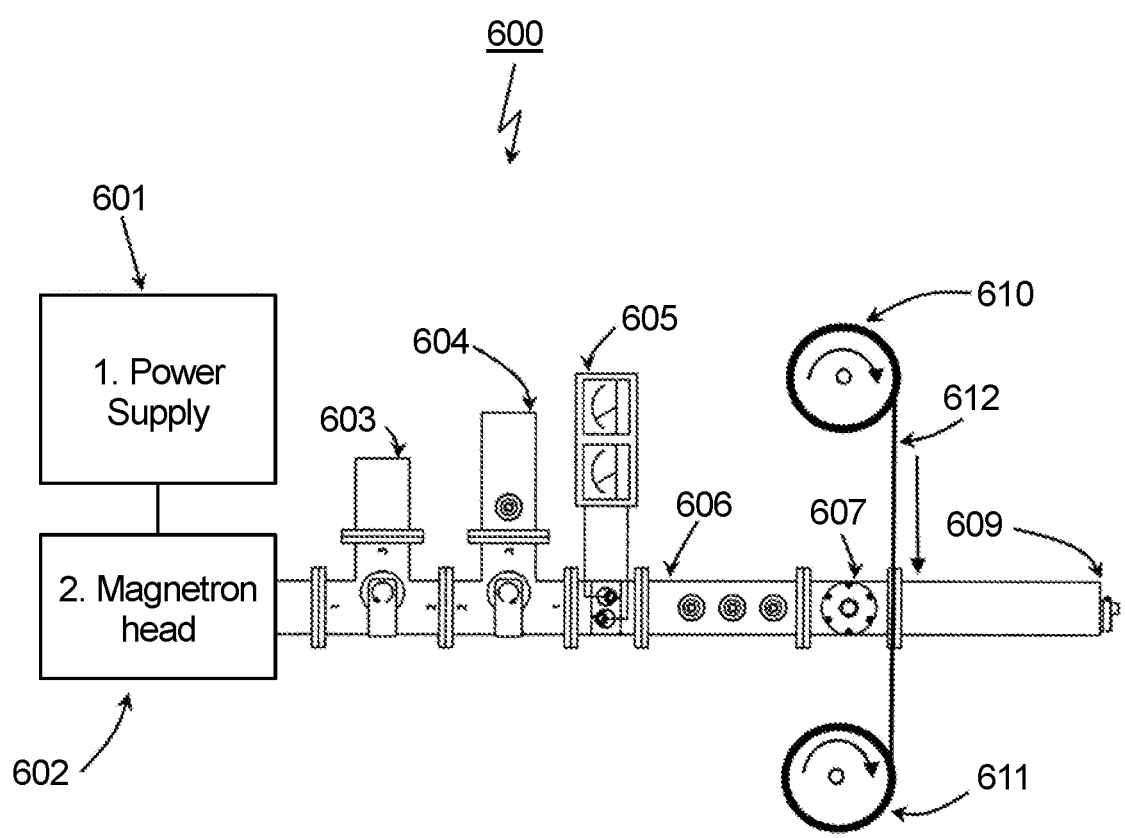
FIG. 5 is a schematic view of a 2.45 GHz silver annealing system operating in a reel-to-reel mode.

FIG. 5 shows a schematic layout of the 2.45 GHz processing system 600. The magnetron head 602 is powered by a high-voltage power supply 601. The magnetron is protected from a reverse power surge by a circulator 603. Tuner 604 is adjusted to match the impedance of the generator with the load. The exfoliated tape 612 is transported through the multimode applicator 607 using a set of reels 610 and 611. The power meter 606 provides the direct and reflected RF power reading. The terminal load 609 absorbs the unused radiofrequency radiation. The applicator 607 is preferably operated in a transverse electric mode (TE103) wherein the magnetic field has a well-defined maximum in the middle of the resonator. The sample is placed in the area of maximum magnetic field, where the largest inductive currents can be achieved. A short pulse (<100 ms) of microwave power is applied by modulation of the anode voltage of the magnetron. The optimum processing conditions are determined by varying the magnetron power and the pulse application duration.

The table shown in FIG. 6 summarizes the thermal properties of the layers comprising the filament. It is to be noted that the thermal diffusion time for the present filament is $9.7 \times 10^{-5}$, which is approximately 0.1 ms. In other words, the sample thermalizes practically instantly. Thus, under adiabatic conditions the temperature would rise to 200° C. after absorption of 300 J of energy. This amount of energy can be delivered by the application of a 1,000 W pulse over 300 ms.

The exfoliation experiments used AMSC Corp standard wire (8602-FCL) as the starting material. The original wire was a 10 mm wide YBCO-RABiTS tape soldered between two 12 mm wide layers of 75 μm thick 316L stainless steel foil with a low-temperature solder. The YBCO filaments were exfoliated after mechanically trimming the side fillets of the tape. In order to facilitate the YBCO layer delamination, the tape was rapidly heated by an inductive coil coupled to the tape. The inductive coil was comprised of eight turns of 14 gauge multi-filament (Litz) wire wound to a 16 cm long and 1 cm wide racetrack shape. The high-frequency generator was designated as an H-bridge driven by optically isolated gate drives. External capacitors were used to form a resonant circuit. A series-connected impedance was employed in order to match the impedance of the generator to the resonant circuit. This design of the inductive coil allowed for a complete coupling of the AC field to the tape. The coil was placed directly under the tape, which ensured complete coupling of the tape to the AC field created by the inductive coil. The coil was energized for 1 to 2 seconds by applying approximately 200 W of AC power at 50 KHz. An infrared thermometer monitored the tape temperature during the exfoliation. The YBCO layer was immediately exfoliated from the substrate. Typically, 10 cm long coupons were exfoliated in a single run.

The illustrative embodiments described herein are not meant to be limiting. Other embodiments may be utilized, and other changes may be made, without departing from the spirit or scope of the subject matter presented here. It will be readily understood that the aspects of the present invention, as generally described herein, and illustrated in the figures, can be arranged, substituted, combined, and designed in a wide variety of different configurations, all of which are explicitly contemplated and made part of this disclosure.

What is claimed is:

1. A method for exfoliating a superconducting tape, said tape including a superconducting layer and a substrate layer, said tape further including a buffer layer positioned between said superconducting layer and said substrate layer, comprising:
    a) providing a continuous length of said tape;
    b) subjecting said tape to an external action which increases the stress level between said superconducting layer and said buffer layer whereby said superconducting layer separates from said buffer and substrate layers; and
    c) spooling said separated superconducting layer and said separated buffer and substrate layers; and further comprising the step of tensioning said tape with a predetermined load applied at a separation angle α to achieve clean separation of said superconducting layer from said buffer and substrate layers;
wherein said separation angle α is from about 2 degrees to about 30 degrees, and wherein said predetermined load is up to about 10 newtons.

2. The method according to claim 1, wherein said tape is provided on a first reel, wherein said separated superconducting layer is spooled on a second reel, and wherein said separated buffer and substrate layers are spooled on a third reel.

3. The method according to claim 2, further comprising:
 a) a first torque motor connected to said second reel; and
 b) a second torque motor connected to said third reel; and
wherein said torque motors apply said predetermined load to said tape.

4. The method according to claim 1, further comprising the steps of:
 a) coating said separated superconductor layer with a silver layer; and
 b) processing said silver layer by application of high-frequency radiation to said silver layer.

5. The method according to claim 4, wherein said high-frequency radiation has a frequency of 2.45 GHz.

6. The method according to claim 5, wherein said processing step is accomplished by applying a short pulse of less than about 100 ms of said high-frequency radiation to said silver layer.

7. The method according to claim 1, further comprising the steps of: coating said separated superconducting layer with a solder paste; and
 passing said coated superconducting layer through a high-temperature zone to melt said solder thereby forming a continuous solder layer.

8. The method according to claim 1, wherein said subjecting step includes the step of rapidly heating said tape.

9. The method according to claim 8, wherein said heating is performed with an inductive coil.

10. The method according to claim 8, wherein said heating is performed with infrared radiation.

11. The method according to claim 8, wherein said heating is performed with radio-frequency radiation.

12. The method according to claim 1, wherein said subjecting step includes the step of mechanically deforming said tape.

13. The method according to claim 1, further comprising the step of slicing said separated superconducting layer prior to spooling of said separated superconducting layer.

14. The method according to claim 13, wherein said slicing step utilizes a laser beam, and wherein the motion of said laser beam is synchronized with the motion of said tape.

15. A method for exfoliating a superconducting tape, said tape including a superconducting layer and a substrate layer, said tape further including a buffer layer positioned between said superconducting layer and said substrate layer, comprising:
 a) providing a continuous length of said tape;
 b) subjecting said tape to an external action which increases the stress level between said superconducting layer and said buffer layer whereby said superconducting layer separates from said buffer and substrate layers thereby defining a separation gap; and
 c) directing a first air blade at said tape to provide a flow of pressurized air into said separation gap to facilitate the uniform and even separation of said superconducting layer from said buffer and substrate layers.

16. The method according to claim 15, wherein said pressurized air is delivered at a pressure of about 20 MPa to about 50 MPa.

17. The method according to claim 15, further comprising the step of tensioning said tape with a predetermined load applied at a separation angle β.

18. The method according to claim 17, wherein said separation angle β is from about 1 degrees to about 10 degrees.

19. The method according to claim 18, wherein said predetermined load is up to about 10 newtons.

20. The method according to claim 15, wherein said pressurized air is heated.

21. The method according to claim 15, further comprising the step of directing a second air blade at said tape.

22. The method according to claim 15, wherein said tape is provided on a first reel, and further comprising the steps of:
 a) spooling said separated superconducting layer on a second reel; and
 b) spooling said separated buffer and substrate layers on a third reel.

23. The method according to claim 22, further comprising:
 a) a first torque motor connected to said second reel; and
 b) a second torque motor connected to said third reel; and
wherein said torque motors apply a predetermined load to said tape.

24. The method according to claim 15, further comprising the steps of:
 a) coating said separated superconductor with a silver layer; and
 b) processing said silver layer by application of high-frequency radiation to said silver layer.

25. The method according to claim 24, wherein said high-frequency radiation has a frequency of 2.45 GHz.

26. The method according to claim 25, wherein said processing step is accomplished by applying a short pulse of less than about 100 ms of said high-frequency radiation to said silver layer.

27. The method according to claim 15, further comprising the steps of:
 coating said separated superconducting layer with a solder paste; and
 passing said coated superconducting layer through a high-temperature zone to melt said solder thereby forming a continuous solder layer.

28. The method according to claim 15, wherein said subjecting step includes the step of rapidly heating said tape.

29. The method according to claim 28, wherein said heating is performed with an inductive coil.

30. The method according to claim 28, wherein said heating is performed with infrared radiation.

31. The method according to claim 28, wherein said heating is performed with radio-frequency radiation.

32. The method according to claim 15, wherein said subjecting step includes the step of mechanically deforming said tape.

33. The method according to claim 15, further comprising the step of slicing said separated superconducting layer prior to spooling of said separated superconducting layer.

34. The method according to claim 33, wherein said slicing step utilizes a laser beam, and wherein the motion of said laser beam is synchronized with the motion of said tape.

35. The method according to claim 15, wherein said air blade includes a flat, slit-like nozzle for directing said pressurized air into said separation gap.

\* \* \* \* \*